United States Patent [19]
Yu et al.

[11] Patent Number: 6,071,094
[45] Date of Patent: Jun. 6, 2000

[54] PHOTORESIST DISPENSE PUMP

[75] Inventors: Cheng-Hung Yu, Kaohsiung; Ming-Der Chou, Hsinchu; Ching-Tsai Luo; Tung-Hsing Tien, both of Hsinchu Hsien, all of Taiwan

[73] Assignee: United Integrated Circuits Corp., Hsinchu, Taiwan

[21] Appl. No.: 09/191,801

[22] Filed: Nov. 13, 1998

[30] Foreign Application Priority Data

Aug. 18, 1998 [TW] Taiwan .................................. 87213523

[51] Int. Cl.⁷ .......................... F04B 45/027; F04B 53/10
[52] U.S. Cl. ........................ 417/441; 417/473; 417/555.1
[58] Field of Search .................... 417/297, 298, 417/441, 473, 555.1; 92/39

[56] References Cited

U.S. PATENT DOCUMENTS

| | | | |
|---|---|---|---|
| 1,580,479 | 4/1926 | Frankenfield | 417/473 |
| 4,139,333 | 2/1979 | Sipos | 417/63 |
| 4,597,719 | 7/1986 | Tano | 417/317 |

FOREIGN PATENT DOCUMENTS 8-143001  6/1996  Japan .

*Primary Examiner*—Andrew M. Dolinar
*Attorney, Agent, or Firm*—J.C. Patents; Jiawei Huang

[57] ABSTRACT

A photoresist dispense pump receives photoresist from two pipelines, a first pipeline and a second pipeline, and pumps out the photoresist through a third pipeline. The photoresist dispense pump contains a first bellows and a second bellows receiving photoresist from the second pipeline, wherein the first bellows and the second bellows are separated by a partition. Photoresist is fed into the third pipeline from the second bellows. On the center region of the partition, there is a central diaphragm that allows photoresist to flow in a direction from the first bellows toward the second bellows, but not in the reverse direction.

14 Claims, 3 Drawing Sheets

PHOTORESIST DISPENSE PUMP

CROSS-REFERENCE TO RELATED APPLICATION

This application claims the priority benefit of Taiwan application serial no. 87213523, filed Aug. 18, 1998, the full disclosure of which is incorporated herein by reference.

BACKGROUND OF THE INVENTION

1. Field of the Invention

This invention relates to equipment used in a semiconductor fabrication process, and more particularly, to a photoresist dispense pump in a coater of a wafer track.

2. Description of Related Art

In the fabrication process of a semiconductor device, steps of performing photolithography processes are repeated for patterning various materials consisted of the semiconductor device. A photolithography process normally includes coating a photoresist layer on the material to be patterned, partially exposing the photoresist layer by using a pre-determined mask, and developing the exposed photoresist layer. In the foregoing process, the photoresist layer is dispensed on a pre-determined plane through a photoresist coater unit of a wafer track.

Generally, a wafer track includes a coater unit for coating photoresist, and a developer unit, wherein the coater unit further includes a photoresist dispense pump for dispensing photoresist. For a conventional wafer track, since the reloading rate of the photoresist dispense pump doesn't always catch the dispensing rate of the photoresist dispense pump during functioning, foam is then generated and stuck within the pump and filter. Hence, a poor coating, such as a photoresist layer contains radial traces caused by the popping of bubbles, or other problem, such as erosion on the inner surface of feeding pipe, happens. The photoresist consists of sensitizer, binder, and methyln n-amyl ketone (MAK), wherein MAK is about 60% to 80% of the photoresist. The vapor pressure of the MAK at a low temperature is relatively low, for example, the vapor pressure of MAK is about 2 to 3 mmHg at 20° C. In the case that the dispensing rate of the photoresist dispense pump is faster than its loading rate during its repeatedly motion, there will be spaces of a lower vapor pressure or even vacuum generated within the the photoresist dispense pump. Hence, bubbles or foams are formed in the photoresist dispense pump.

FIG. 1 is a diagram that shows the photoresist-loading path of the photoresist dispense pump of a conventional wafer track. Referring to FIG. 1, photoresist is firstly transferred from a photoresist supply gallon bottle 10 toward the buffer tank by controlling the nitrogen gas filled into the photoresist supply gallon bottle tank 10. Then, photoresist is transferred into a bellows pump 14. By the repeated motion of the bellows pump 14, photoresist is again transferred to a filter 16. The filtered photoresist s transferred to a nozzle and dispensed out on a pre-determined plane. However, since the retrieving rate of the bellows pump 14 doesn't match the photoresist-reloading rate, the pressures inside and outside the bellows are different. The difference on the pressures inside and outside the bellows further leads the formation of foams and bubbles, and other problems.

SUMMARY OF THE INVENTION

It is therefore an objective of the present invention to provide a photoresist dispense pump to prevent the pressure difference happening in feeding and reloading photoresist to reduce the formation of foams and bubbles in the coater unit of a wafer track.

In accordance with the foregoing and other objectives of the present invention, the invention provides a photoresist dispense pump of a wafer track that balances the pressures on two sides of the pump, the inlet and outlet, by applying the principle of dynamic balance to obtain a better coating.

The photoresist dispense pump of the invention receives photoresist from two pipelines, a first pipeline and a second pipeline, and pumps out the photoresist through a third pipeline. The photoresist dispense pump of the invention contains a first bellows and a second bellows receiving photoresist from the second pipeline, wherein the first bellows and the second bellows are separated by a partition. Photoresist is fed into the third pipeline from the second bellows. On the center region of the partition, there is a central diaphragm that allows photoresist to flow in a direction from the first bellows toward the second bellows, but not in the reverse direction.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

Figure 1:
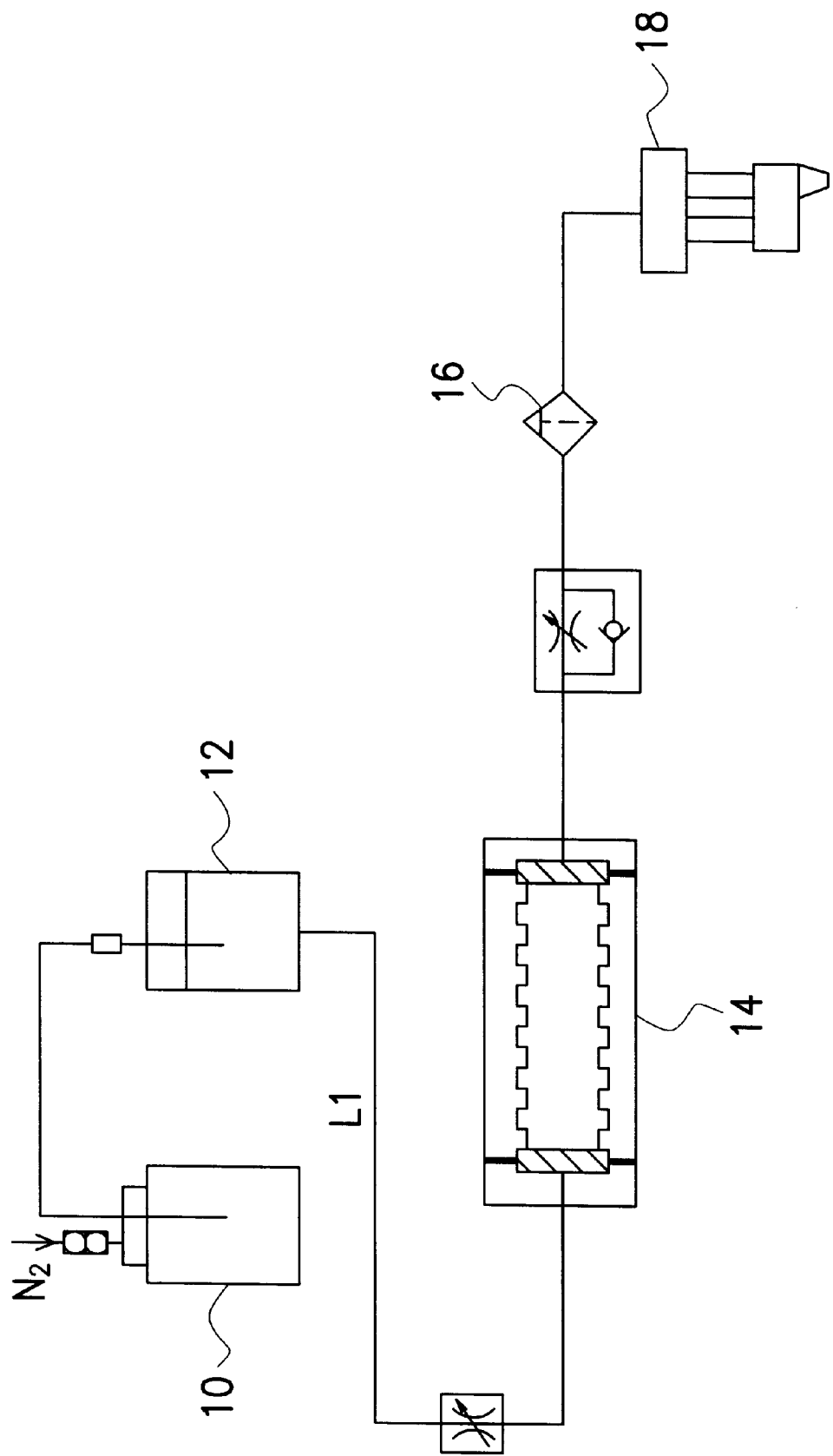
FIG. 1 is a schematic block diagram showing the partial structure of the coater unit of a conventional wafer track.
Figure 2:
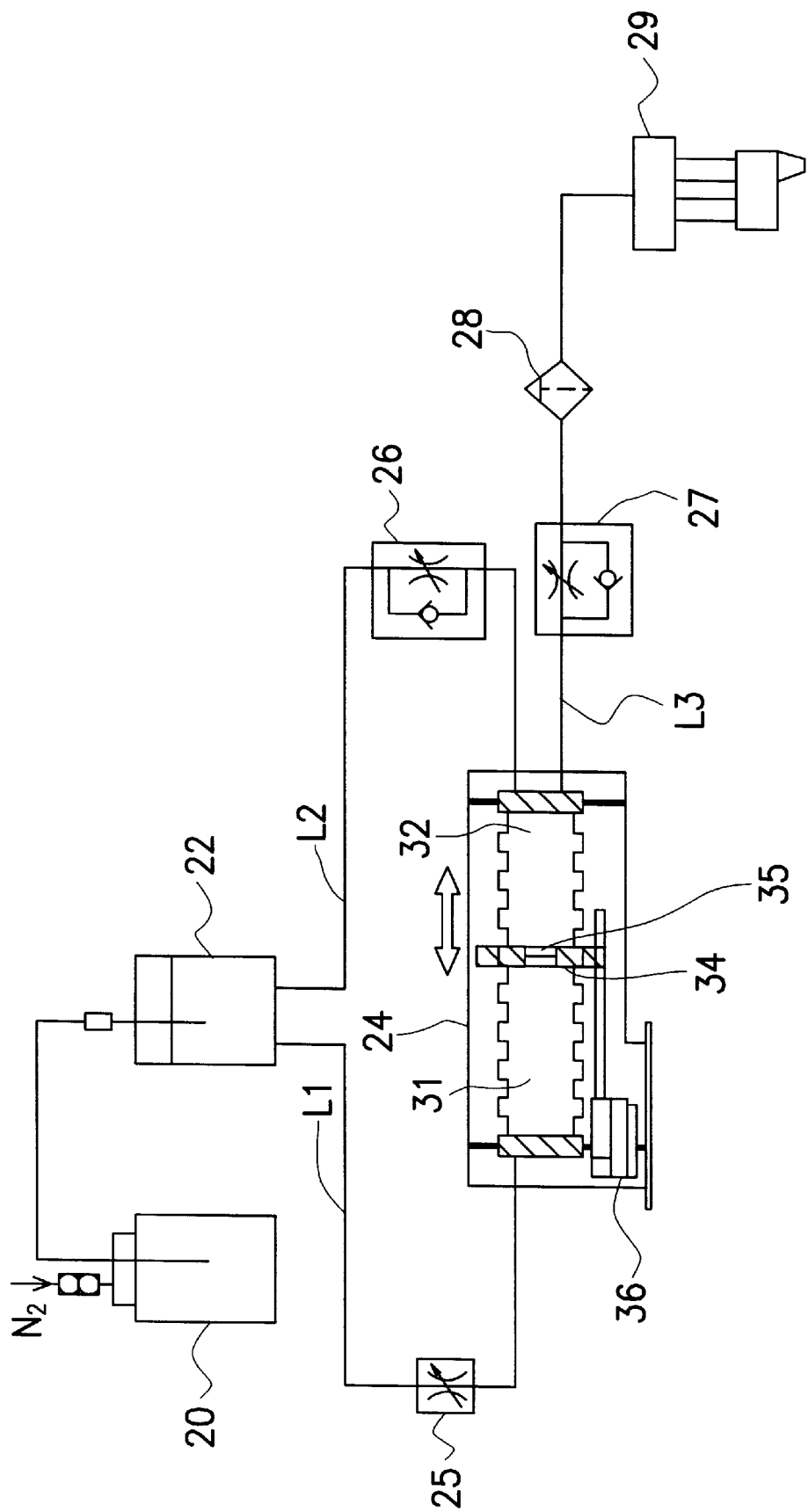
FIG. 2 is a schematic block diagram showing the partial structure of the coater unit of a wafer track described in a preferred embodiment according to the invention.

The invention provides a photoresist dispense pump of a coater unit in a wafer track for obtaining a better coating, as shown in FIG. 2.

Referring to FIG. 2, as in a conventional coater unit, photoresist is first transferred into a buffer tank 22 from a photoresist supply gallon bottle 20 by injecting nitrogen gas into the photoresist supply gallon bottle 20.

The photoresist is then fed into a bellows pump 24 through two pipelines L1 and L2, which are respectively connected to two opposite ends of the bellows pump 24. A throttle 25, which is set along the pipeline L1 before the pump 24, is used to control the photoresist fed into the bellows pump 24 through the pipeline L1. A check valve 26, which is set along the pipeline L2 before the pump 24, is used to control the photoresist fed into the pump 24 through the pipeline L2. Another check valve 27, which is set along the pipeline L3 between the pump 24 and filter 28, is used to control the photoresist fed into the filter 27 through the pipeline L3. The filtered photoresist is then dispensed onto a desired plane through the nozzle 29.

The bellows pump 24 of the invention, further consists of two bellows 31 and 32 for receiving and containing the photoresist fed from the pipelines L1 and L2 respectively, wherein the bellows 31 and 32 are separated through a partition 34. The partition 34 further contains a central diaphragm 35 for preventing that the photoresist flows from the bellows 32 to bellows 31. In the case that the partition 34 is moving toward the left end of the bellows pump 24, photoresist flows from the bellows 31 to the bellows 32 through the central diaphragm 35. On the other hand, no photoresist flows into the bellows 31 from the bellows 32 when the partition 34 is moving toward the left end of the bellows pump 24, wherein the two ends of the bellows pump 24 are fixed. The partition 34 is driven by a driving motor 36, or any other driving devices that are capable of providing the similar function. The pipelines L1 and L2 have the same property including actual length and friction factor on the inner walls in order to keep the pressures, which include static pressure and dynamic pressure, of the bellows 31 and 32 are isopiestic.

Figure 3A:
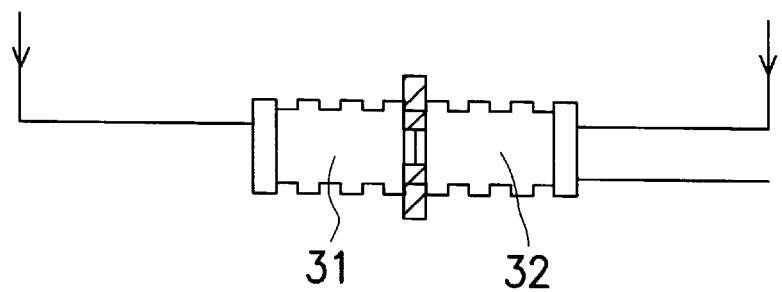
FIGS. 3A through 3C are schematic diagrams showing the static balance and the dynamic balance of the photoresist inside the photoresist dispense pump of the invention.
Figure 3B:
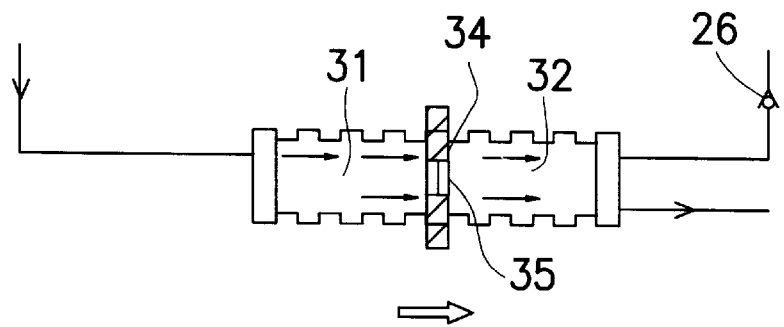
Figure 3C:
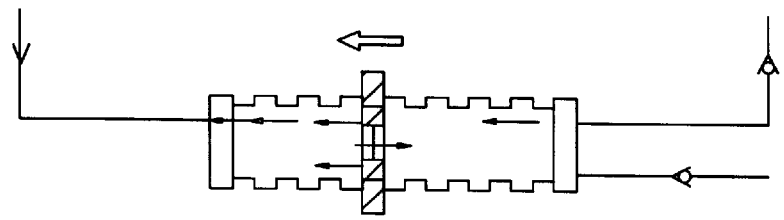

The status of photoresist flow within the bellows 31 and 32, under various movements of the partition 34, are shown in FIGS. 3A through 3C.

Referring to FIG. 3A, when the bellows pump 24 is idle, the pressures in the bellows 31 and 32 are statically balanced regardless the volumes of bellows 31 and 32.

Referring next to FIG. 3B together with FIG. 2, when the bellows pump 24 is pumping out photoresist, the partition 34 is moved toward the right end of the bellows pump 24 by the driving motor 36. The photoresist in the bellows 32 is forced to flow outward through the pipeline L3 only because of the presence of the central diaphragm 35 and the check valve 26. With the supplement from the pipeline L1, photoresist is filled into the bellows 31, so the pressures in the bellows 31 and 32 remain isopiestic, that is, dynamically balanced.

Referring to FIG. 3C together with FIG. 2, when the bellows pump 24 is retrieved, the partition 34 is moved toward the original position or the left end of the bellows pump 24 by the driving motor 36. The photoresist in the bellows 31 is forced to flow into the bellows 32 through the central diaphragm to complement the reduced pressure. The bellows 32 also receives photoresist from the pipeline L2 in order to get to a dynamic balance quicker. A portion of the photoresist in the bellows 31 flows back to the buffer tank 22 through the pipeline L1 if a pressure balance is reached. In the presence of the check valve 27, which prevents photoresist flows into the bellows 32 from the pipeline L3, there is no vacuum or foam is generated in the bellows pump 24 or the pipeline L3. The photoresist in the bellows 31 provides resistance on the partition 34 to ensure a stable retrieving process performed on the bellows pump 24.

Because photoresist fed into the bellows pump 24 through pipelines L1 and L2, a pressure balance between bellows 31 and 32 is easily reached while the partition 34 is repeatedly moved toward right and left. Hence, a better coating is obtained.

According to the foregoing, the bellows pump of the invention is able to remain a dynamic balance on the photoresist pressure by using two bellows 31 and 32 and a partition to ensure a better coating.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A photoresist dispense pump of a coating unit in a wafer track that receives photoresist from a first pipeline and a second pipeline, and pumps out photoresist through a third pipeline, the photoresist dispense pump comprising:

a first bellows receiving photoresist fed through the first pipeline;

a second bellows receiving photoresist fed through the second pipeline; and a partition for separating the first bellows and the second bellows, wherein the partition has a central diaphragm located in the center of the partition, and wherein the central diaphragm only allows photoresist to flow from the first bellows toward the second bellows, but not in an opposite direction.

2. The photoresist dispense pump of claim 1, wherein the first pipeline further contains a throttle controlling a flux of photoresist.

3. The photoresist dispense pump of claim 1, wherein the second pipeline further contains a first check valve controlling a flux of photoresist.

4. The photoresist dispense pump of claim 1 wherein the photoresist dispense pump serves as a bellows pump.

5. The photoresist dispense pump of claim 1, wherein the first pipeline and the second pipeline are equal in length.

6. The photoresist dispense pump of claim 1, wherein the partition is driven by a driving motor.

7. The photoresist dispense pump of claim 1, wherein the first bellows and the second bellows are isopiestic when the photoresist dispense pump is idle.

8. The photoresist dispense pump of claim 1, wherein the partition is moved toward the second bellows when the photoresist dispense pump is pumping out photoresist, and wherein photoresist is forced to flow outward through the third pipeline, and simultaneously fed into the first bellows through the first pipeline.

9. The photoresist dispense pump of claim 8, wherein a first check valve is included on the second pipeline to prevent that photoresist flows into the second pipeline from the second bellows.

10. The photoresist dispense pump of claim 1, wherein the partition is moved toward the first bellows when the photoresist dispense pump is retrieving, and wherein photoresist is forced to flow from the first bellows to the second bellows through the central diaphragm, and simultaneously fed into the second bellows through the second pipeline.

11. The photoresist dispense pump of claim 10, wherein the third pipeline further comprises a second check valve, and wherein the second check valve is used to prevent that photoresist flows into the second bellows from the third pipeline.

12. The photoresist dispense pump of claim 10, wherein a portion of photoresist flows back to the first pipeline from the first bellows.

13. The photoresist dispense pump of claim 1, wherein the third pipeline comprises a second check valve for controlling photoresist flux.

14. The photoresist dispense pump of claim 1, wherein the first pipeline, the second pipeline, and the third pipeline respectively include a throttle, a first check valve, and a second check valve, all of which are used together to control photoresist flux.

* * * * *